(12) United States Patent
Hwang et al.

(10) Patent No.: US 8,320,203 B2
(45) Date of Patent: Nov. 27, 2012

(54) METHOD AND SYSTEM TO LOWER THE MINIMUM OPERATING VOLTAGE OF REGISTER FILES

(75) Inventors: Seung H. Hwang, Portland, OR (US); Sapumal B. Wijeratne, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 279 days.

(21) Appl. No.: 12/748,208

(22) Filed: Mar. 26, 2010

(65) Prior Publication Data

US 2011/0235445 A1    Sep. 29, 2011

(51) Int. Cl.
*G11C 7/00* (2006.01)
(52) U.S. Cl. .................. 365/191; 365/154; 365/226
(58) Field of Classification Search .............. 365/191, 365/154, 156, 226
See application file for complete search history.

(56) References Cited

U.S. PATENT DOCUMENTS 5,668,770 A    9/1997    Itoh et al.

| | | |
|---|---|---|
| 2004/0179406 A1 | 9/2004 | Kushida |
| 2005/0024917 A1 | 2/2005 | Yamaoka et al. |
| 2007/0081407 A1 | 4/2007 | Maki et al. |
| 2007/0274124 A1 | 11/2007 | Otsuka |
| 2008/0266995 A1* | 10/2008 | Lih et al. .................. 365/226 |
| 2009/0135661 A1 | 5/2009 | Hold |
| 2011/0069566 A1 | 3/2011 | Damaraju et al. |

FOREIGN PATENT DOCUMENTS

WO    WO-2008097782    8/2008

OTHER PUBLICATIONS

Combined Search and Examination Report for Great Britain Patent Application No. GB11050291, Mailed Jun. 23, 2011, 9 pages.

* cited by examiner

*Primary Examiner* — Huan Hoang
(74) *Attorney, Agent, or Firm* — Garrett IP, LLC

(57) ABSTRACT

A method and system to lower the minimum operating voltage of a register file without increasing the area of each bit cell of the register file. In one embodiment of the invention, the register file is coupled to logic that reduces the contention between the NMOS devices and the PMOS devices in each bit cell of the register file during write and/or read operations of the register file. By doing so, the register file is able to operate at a lower minimum operating voltage.

20 Claims, 3 Drawing Sheets

METHOD AND SYSTEM TO LOWER THE MINIMUM OPERATING VOLTAGE OF REGISTER FILES

FIELD OF THE INVENTION

This invention relates to register files, and more specifically but not exclusively, to a method and system to lower the minimum operating voltage of the register files.

BACKGROUND DESCRIPTION

In a memory array such as a register file array, the minimum operating voltage ($VCC_{min}$) of the memory array is typically limited by the write and/or read operation of the memory array. This is due to the contention between the negative-channel metal-oxide-semiconductor field effect transistor (MOSFET) (NMOS) devices and the positive-channel MOSFET (PMOS) devices in the memory array. The contention poses a problem for a system that employs the memory array, especially when the $VCC_{min}$ of the memory array limits the $VCC_{min}$ of the entire system.

FIG. 1 illustrates a prior art shared PMOS scheme 100 in a register file bit cell 110. The register file bit cell 110 illustrates one of the bit cells in a register file. The register file bit cell 110 has cross-coupled transistors 111, 112, 113 and 114. The transistors 115 and 116 allow access to a complementary bit (bitx) node 122 and a bit node 120 respectively. The bit node 120 and the bitx node 122 stores the bit value and complementary bit value of the register file bit cell 110 respectively. When the write word line 140 enables the transistors 115 and 116, the write input 130 allows the data to be written to the register file bit cell 110 via the write bit line 150 and the complementary bit line 155. The value of the bit node 120 can be read using the transistors 117 and 118 via the read bit line 170 when the read word line 160 enables the transistor 118.

The PMOS transistor 119 is connected to the PMOS transistors 111 and 112 and is also connected or shared with the other PMOS transistors in the other register file bit cells. The PMOS transistor 119 weakens the pull-up strength of the PMOS transistors 111 and 112 and improves the write jamming ratio, i.e., the ratio of the strength of the NMOS transistor 115 to the effective strength of the PMOS transistors 111 and 119.

However, as the size of transistors becomes smaller and smaller, the prior art shared PMOS scheme 100 is unable to keep up with the reduction in the $VCC_{min}$ of the register files. The size of the NMOS transistors 115 and 116 can be increased to improve write jamming ratio but the area of the bit cell would have to be increased.

BRIEF DESCRIPTION OF THE DRAWINGS

The features and advantages of embodiments of the invention will become apparent from the following detailed description of the subject matter in which.

DETAILED DESCRIPTION

Figure 1:
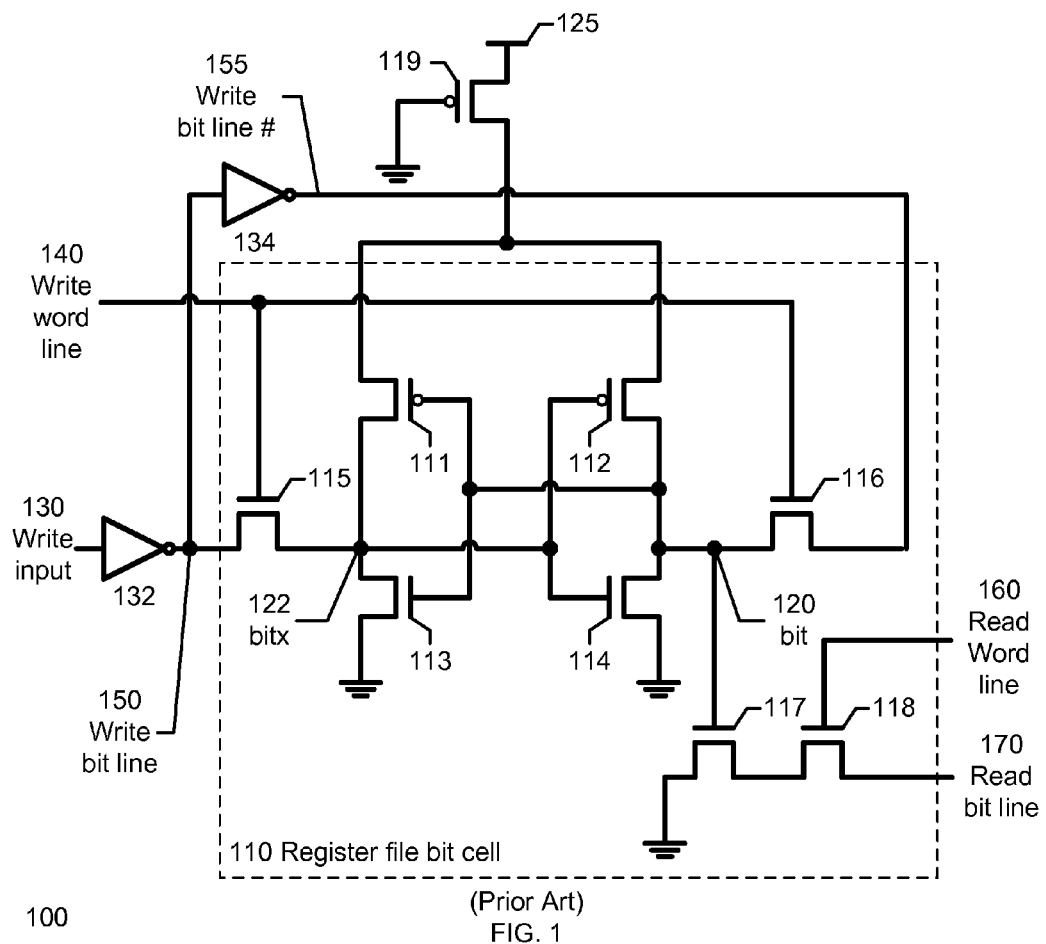
FIG. 1 illustrates a prior art shared PMOS scheme 100 in a register file bit cell.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to lower the minimum operating voltage of a register file without increasing the area of each bit cell of the register file in accordance with one embodiment of the invention. In one embodiment of the invention, the register file is coupled to logic that reduces the contention between the NMOS devices and the PMOS devices in each bit cell of the register file during write and/or read operations of the register file. By doing so, the register file is able to operate at a lower minimum operating voltage.

In one embodiment of the invention, the logic weakens the pull-up strength of the PMOS devices in each register file bit cell and it improves the write jamming ratio, i.e., the ratio of the strength of NMOS devices to the effective strength of the PMOS devices. With a high write jamming ratio, the probability of the completion of a write operation is increased. In one embodiment of the invention, the logic to reduce the contention is performed based on the input data signals to the register file. This allows the logic to be driven or controlled by the input data to the register file.

For clarity of illustration, a register file is described with embodiments of the invention. However, this is not meant to be limiting and embodiments of the invention work with other forms of memory arrays, including, but not limited to, static random access memories (SRAM), dynamic RAM (DRAM), read only memories (ROM), and the like. One of ordinary skill in the relevant art will readily appreciate how to apply workings of the invention to the other forms of memory arrays. In one embodiment of the invention, the register file utilizes, but is not limited to, memory cells such as 5T, 6T, 8T, 10T, and any other memory cell configuration.

Figure 2:
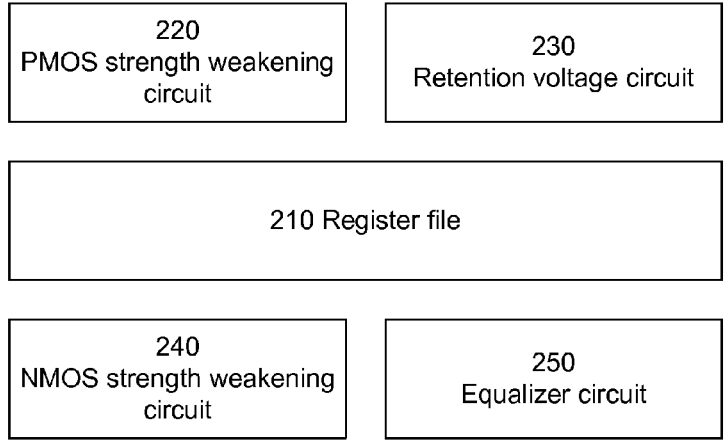
FIG. 2 illustrates a block diagram of the logic to lower the minimum operating voltage of a register file in accordance with one embodiment of the invention.

FIG. 2 illustrates a block diagram 200 of the logic to lower the minimum operating voltage of a register file in accordance with one embodiment of the invention. The logic has a PMOS strength weakening circuit 220, a retention voltage circuit 230, a NMOS strength weakening circuit 240, and an equalizer circuit 250 that are connect to a register file 210.

The PMOS strength weakening circuit 220 weakens the PMOS strength at the bit and bitx nodes during a write operation. By doing so, the write jamming ratio is increased and the contention of the PMOS devices and the NMOS devices is reduced. This improves the completion of any write operation and allows the minimum operating voltage of the register file to be lowered. The NMOS strength weakening circuit 240 weakens the cross-coupled NMOS devices 113 and 114 in the register file 210 and allows the bit and bitx nodes to rise faster and improves the write delay at low voltages in one embodiment of the invention.

The retention voltage circuit 230 supplies current to each bit cell of the register file when the register file is in an inactive mode and it helps to prevent bit flipping, i.e., flip in the bit value and/or complementary bit value, in the register file 210 due to leakage current or resistive defects. The equalizer circuit 250 is coupled with the register file 210 to prevent the voltage lines in the register file 210 from floating, i.e., voltage at an undetermined voltage level, during a write operation or cycle of the register file.

The logic to improve the minimum operating voltage of the register file 210 is included in, but not limited to, a processor, controller, and any device that requires the register file. The logic illustrated in FIG. 2 is not meant to be limiting. In one embodiment of the invention, all the blocks in the logic are combined into a single block. In another embodiment of the invention, the logic is embedded within the register file 210. One of ordinary skill in the relevant art will appreciate that other configurations of the logic can be used without affecting the workings of the invention.

Figure 3:
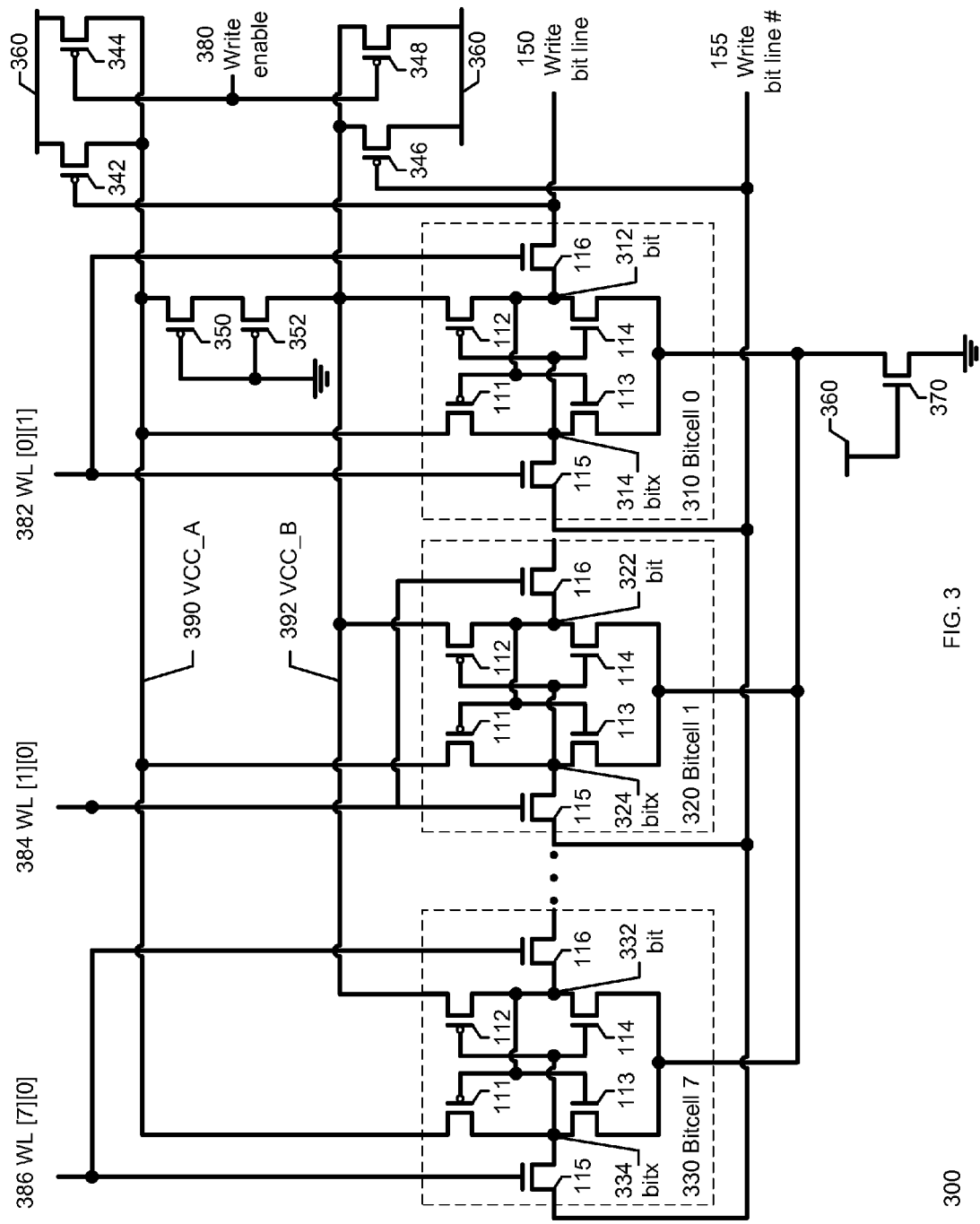
FIG. 3 illustrates a circuit diagram to lower the minimum operating voltage of a register file in accordance with one embodiment of the invention.

FIG. 3 illustrates a circuit diagram 300 to lower the minimum operating voltage of a register file in accordance with one embodiment of the invention. For clarity of illustration, FIG. 3 is discussed with reference to FIG. 2. The bit cell 0 310, bit cell 1 320 and bit cell 7 330 illustrate the bit cells of the register file 210. The bit cells 2-6 are not illustrated for clarity of illustration and these bit cells have the same functionality as the bit cell 0 310.

The bit cell 0 310 has cross-coupled transistors 111, 112, 113, and 114. The NMOS transistor 116 is connected with the bit node 312 and the write bit line 150. The NMOS transistor 115 is connected with the bitx node 314 and the complementary write bit line (write bit line #) 155. The gate node of the NMOS transistors 115 and 116 are connected to VCC enabled word line [0] (WL [0][1], the second bracket denotes the logic state of the VCC enabled word line) 382. For clarity of illustration, the circuit to read the bit node 312 is not shown in FIG. 3. The bit cells 1-7 have the same design as bit cell 0 310 and shall not be repeated herein.

The PMOS transistor 342 is connected to a supply voltage 360 and it supplies a voltage VCC_A 390 to the PMOS transistor 111 of each bit cell 0-7 when the PMOS transistor 342 is activated or enabled. The write bit line 150 controls the activation of the PMOS transistor 342 via the gate node of the PMOS transistor 342. The PMOS transistor 346 is connected to the supply voltage 360 and it supplies a voltage VCC_B 392 to the PMOS transistor 112 of each bit cell 0-7 when the PMOS transistor 346 is activated or enabled. The complementary write bit line 155 controls the activation of the PMOS transistor 346 via the gate node of the PMOS transistor 346. In one embodiment of the invention, the PMOS transistors 342 and 346 performs the functionality of the PMOS strength weakening circuit 220.

In one embodiment of the invention, the equalizer circuit 250 is coupled with the voltage VCC_A 390 and the voltage VCC_B 392 to prevent them from floating during a write operation or cycle of the register file 210. The equalizer circuit 250 is implemented with two PMOS transistors 350 and 352 in one embodiment of the invention. The source node of the PMOS transistor 350 connects to the voltage VCC_A 390 and the drain node of the PMOS transistor 352 connects to the voltage VCC_B 392. The drain node of the PMOS transistor 350 connects to the source node of the PMOS transistor 352. The gate node of the PMOS transistors 350 and 352 connects to a ground voltage. The implementation of the equalizer circuit 250 is not meant to be limiting and one of ordinary skill in the relevant art will readily appreciate that other equalizer circuits can be used without affecting the workings of the invention.

In one embodiment of the invention, the retention voltage circuit 230 is coupled with the voltage VCC_A 390 and the voltage VCC_B 392 to supply current to each bit cell of the register file 210 when the register file 210 is in an inactive mode. In one embodiment of the invention, the retention voltage circuit 230 supplies current to prevent any bit flipping, i.e., flip in the bit value stored in the bit node 312 and/or the complementary bit value stored in the bitx node 314, that is caused by leakage current. The retention voltage circuit 230 is implemented with two PMOS transistors 344 and 348 in one embodiment of the invention. The drain node of the PMOS transistors 344 and 348 connects to the voltage VCC_A 390 and the voltage VCC_B 392 respectively. The source node of the PMOS transistors 344 and 348 connects to the power supply 360. The gate node of the PMOS transistors 344 and 348 connects to a write enable signal 380. In one embodiment of the invention, the write enable signal 380 is generated based on a write enable clock and a most significant bit address signal of the input data to the register file 210.

The write enable signal 380 enables the retention voltage circuit 230 during any non-active write cycles or operations of the register file 210. The retention voltage circuit 230 is meant as an illustration and one of ordinary skill in the relevant art will readily appreciate that other retention voltage circuits can be used without affecting the workings of the invention.

When the register file 210 is in idle cycle, the write enable signal 380 is set as logic zero to enable the retention voltage circuit 230, i.e., transistors 344 and 348. The transistors 344 and 348 are activated by the write enable signal 380 and the voltage VCC_A 390 and the voltage VCC_B 392 are held or set to the supply voltage. At the onset of a write cycle, the write enable signal 380 disables the retention voltage circuit 230.

When the bit cell 0 310 of the register file 210 is in a write cycle, the write bit line 150 and the complementary write bit line 155 are assumed to be set to logic one and logic zero respectively for the purposes of illustration. The bit value stored at the bit node 312 and the complementary bit value stored at the bitx node 314 are assumed to store a value of logic zero and logic one respectively. The write enable signal 380 is set as logic one during the write cycle to disable the PMOS transistors 344 and 348.

Prior to the write cycle, the current to the PMOS transistors 342 and 346 cannot be on at the same time since they are controlled by mutually exclusive signals, i.e., the write bit line 150 and the complementary write bit line 155. For the purposes of illustration, for the current write cycle, the write bit line 150 is set at logic one and the complementary write bit line 155 is set at logic zero. Therefore, the PMOS transistor 346 is activated and the PMOS transistor 342 is deactivated. Prior to the write cycle, the circuit 300 is in retention mode and the PMOS devices 344 and 348 sustain or provide VCC_A 390 and VCC_B 392 respectively as the write enable signal 380 is set to logic zero. VCC_A 390 also has a parallel sustaining path through the PMOS transistors 346, 352, and 350. During the write cycle, the retention PMOS transistors 344 and 348 are turned off and the PMOS strength at the bitx node 314 is weakened since it is only sustained by the series connection of the PMOS transistors 346, 352, and 350. The bitx node 314 has a lower or weakened effective PMOS strength of the combination of the PMOS transistors 350, 352 and 346. As such, the contention of writing logic zero to the bitx node 314 is significantly mitigated due to the increase in the write jamming ratio.

The PMOS transistor 346 assists the completion of the writing of logic one to the bit node 312 as it pulls up the PMOS transistor 112. In one embodiment of the invention, the asymmetric PMOS strength at the bit node 312 and the bitx node 314 during a write cycle mitigates or reduces the contention in the register bit cell 310 without affecting completion of the write operation and improves the $VCC_{min}$ of the register file 210.

The NMOS strength at the bit node 312 is weakened by the NMOS stack formed by the NMOS transistor 370. The NMOS transistor 370 performs the functionality of the NMOS strength weakening circuit 240 in one embodiment of the invention. The gate node of the NMOS transistor 370 is connected to the power supply 360 and the NMOS transistor 370 is enabled. The NMOS transistor 370 allows the bit node 312 to rise faster and helps the contending transistor 111 at the bitx node 314 to turn off faster. It also improves the write delay at low voltage. The register file 210 is allowed to operating at a lower voltage without the need to increase the area of the bits cells in one embodiment of the invention. By operating at a lower voltage, the register file 210 allows a system to save power and the improve the ratio of system performance to the consumed power.

Figure 4:
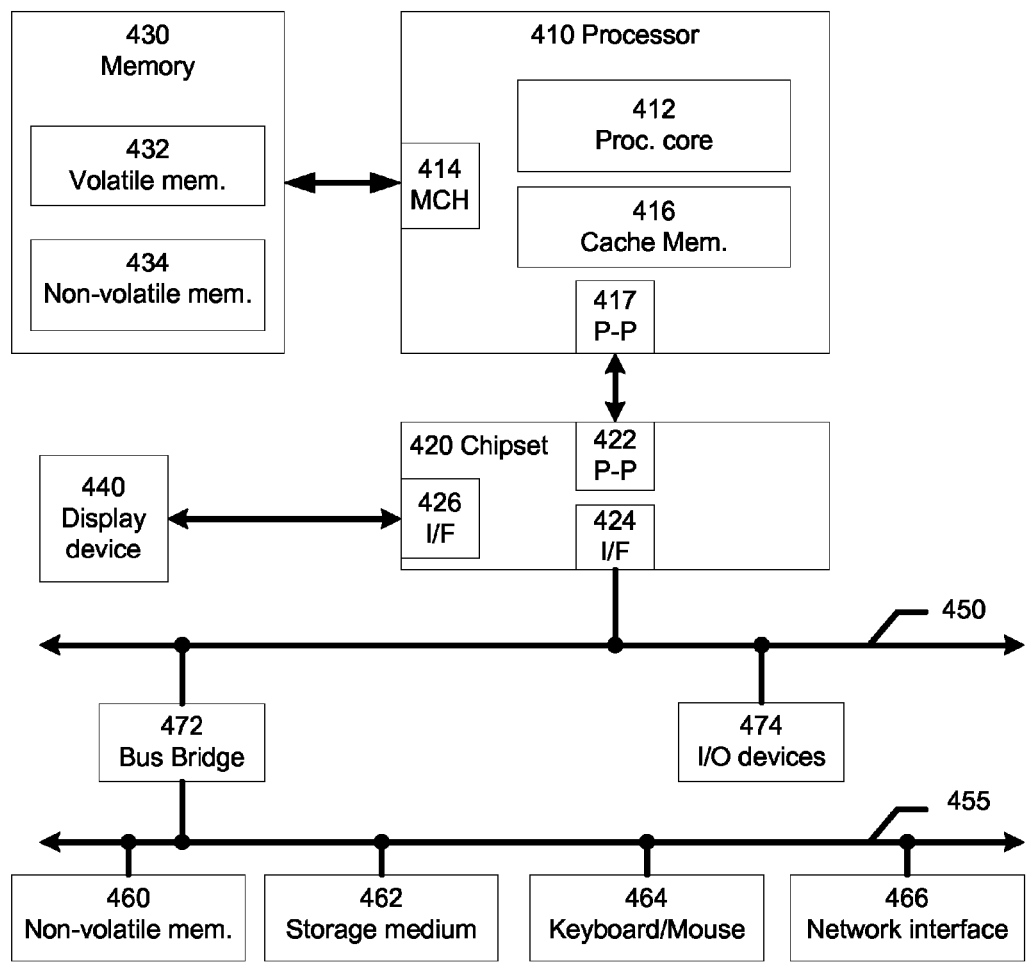
FIG. 4 illustrates a system to implement the methods disclosed herein in accordance with one embodiment of the invention.

FIG. 4 illustrates a system 400 to implement the methods disclosed herein in accordance with one embodiment of the invention. The system 400 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 400 used to implement the methods disclosed herein may be a system on a chip (SOC) system.

The processor 410 has a processing core 412 to execute instructions of the system 400. The processing core 412 includes, but is not limited to, pre-fetch logic to fetch instructions, decode logic to decode the instructions, execution logic to execute instructions and the like. The processor 410 has a cache memory 416 to cache instructions and/or data of the system 400. In another embodiment of the invention, the cache memory 416 includes, but is not limited to, level one, level two and level three, cache memory or any other configuration of the cache memory within the processor 410. The processor 410 has the register file 210 and the logic to lower the minimum operating voltage of the register file 210 in one embodiment of the invention.

The memory control hub (MCH) 414 performs functions that enable the processor 410 to access and communicate with a memory 430 that includes a volatile memory 432 and/or a non-volatile memory 434. The volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, NAND flash memory, phase change memory (PCM), read only memory (ROM), electrically erasable programmable read only memory (EEPROM), or any other type of non-volatile memory device.

The memory 430 stores information and instructions to be executed by the processor 410. The memory 430 may also stores temporary variables or other intermediate information while the processor 410 is executing instructions. The chipset 420 connects with the processor 410 via Point-to-Point (PtP) interfaces 417 and 422. The chipset 420 enables the processor 410 to connect to other modules in the system 400. In one embodiment of the invention, the interfaces 417 and 422 operate in accordance with a PtP communication protocol such as the Intel® QuickPath Interconnect (QPI) or the like. The chipset 420 connects to a display device 440 that includes, but is not limited to, liquid crystal display (LCD), cathode ray tube (CRT) display, or any other form of visual display device.

In addition, the chipset 420 connects to one or more buses 450 and 455 that interconnect the various modules 474, 460, 462, 464, and 466. Buses 450 and 455 may be interconnected together via a bus bridge 472 if there is a mismatch in bus speed or communication protocol. The chipset 420 couples with, but is not limited to, a non-volatile memory 460, a mass storage device(s) 462, a keyboard/mouse 464 and a network interface 466. The mass storage device 462 includes, but is not limited to, a solid state drive, a hard disk drive, an universal serial bus flash memory drive, or any other form of computer data storage medium. The network interface 466 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although the cache memory 416 is depicted as a separate block within the processor 410, the cache memory 416 can be incorporated into the processor core 412 respectively. The system 400 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus, comprising:
   a bit cell having
      a first storage node to store a value asserted on a write bit line, and
      a second storage node to store a value asserted via a second write bit line that is complementary to the first write bit line value; and
   a circuit, including:
      a pull up switch circuit to selectively apply an operating voltage to one of a first voltage node coupled to the first storage node and a second voltage node coupled to the second storage node, under control of the complementary write bit line values; and
      a voltage equalizer connected between the first and second voltage nodes, wherein, during a write to the bit cell, one of the first and second storage nodes into which a write bit line value of logic 1 is to be written is pulled up strongly to the operating voltage through the switch circuit, and the other of the first and second storage nodes into which a write bit line value of logic 0 is to be written is pulled up weakly through both the switch circuit and the voltage equalizer connected in series.

2. The circuit of claim 1, wherein the pull up switch circuit includes:
   a first transistor to selectively apply the operating voltage to the first voltage node under control of the first write bit line value; and
   a second transistor to selectively apply the operating voltage to the second voltage node under control of the complementary second write bit line value,
   wherein to write the write bit line values of logic 1 and logic 0 to the first and second storage nodes, respectively, the first storage node is pulled up strongly to the operating voltage through the first transistor, and the second storage node is pulled up weakly to the operating voltage through the first transistor and the equalizer connected in series, and
   wherein to write the write bit line values of logic 0 and logic 1 to the first and second storage nodes, respectively, the first storage node is pulled up weakly to the operating voltage through the second transistor and the voltage equalizer connected in series, and the second storage node is pulled up strongly to the operating voltage through the second transistor.

3. The circuit of claim 1, wherein:
   the pull up switch circuit includes a transistor source-drain current path through which the operating voltage is selectively applied to the one of the first and second voltage nodes; and
   the voltage equalizer includes at least one transistor source-drain current path connected between the first and second voltage nodes, such that the one of the first and second storage nodes to which the logic one is to be written is pulled up strongly through the pull up circuit transistor source-drain current path, and the other of the first and second storage nodes to which the logic 0 is to be written is pulled up weakly through the pull up circuit transistor source-drain current path and the voltage equalizer at least one transistor source-drain current path connected in series.

4. The circuit of claim 1, wherein the voltage equalizer includes first and second transistors having their source-drain current paths connected in series between the first and second voltage nodes and each of their gates connected a voltage supply rail to keep the first and second transistors always turned on.

5. The circuit of claim 4, wherein the pull up switch circuit includes:
   a first switch transistor having a source-drain current path connected between the operating voltage and the first voltage node, and a gate controlled by the first write bit line; and
   a second switch transistor having a source-drain current path connected between the operating voltage and the second voltage node, and a gate controlled by the second write bit line.

6. The circuit of claim 1, wherein the circuit further comprises a pull down weakening circuit, coupled to the first and second storage nodes, to weaken a pull down strength applied to the first and second storage nodes.

7. The circuit of claim 1, wherein the bit cell further comprises first and second cross-coupled inverters, the first inverter including a bit cell first pull up transistor coupled between the first storage node and the first voltage node, the second inverter including a bit cell second pull up transistor coupled between the second storage node and the second voltage node, wherein during the write to the bit cell the first and second storage nodes are pulled up to the operating voltage through the respective bit cell first and second pull up transistors and at least one of the switch circuit and the voltage equalizer, under control of the write line bit values.

8. The circuit of claim 7, wherein the first inverter further includes a bit cell first pull down transistor coupled between the first storage node and a pull down voltage node, and the bit cell second inverter further includes a bit cell second pull down transistor coupled between the second storage node and the pull down voltage node, the circuit further comprising a pull down weakening transistor having its source-drain current path connected between the pull down voltage node and a ground potential.

9. The circuit of claim 1, wherein the circuit further includes a logic retention circuit to provide a retention voltage to the first and second voltage nodes under control of a write enable signal so that the retention voltage is applied when the write to the bit cell does not occur.

10. The circuit of claim 9, wherein the logic retention circuit includes:
   a logic retention first switch transistor having a source-drain current path connected between the operating voltage and the first voltage node, and a gate controlled by the write enable signal; and a logic retention second switch transistor having a source-drain current path connected between the operating voltage and the second voltage node, and a gate controlled by the write enable signal.

11. A system, comprising:
a memory to store instructions;
a processor to execute the instructions stored in memory; and
a display device connected with the processor and the memory, wherein the processor includes memory having:
   a bit cell having
      a first storage node to store a value asserted on a write bit line, and
      a second storage node to store a value asserted via a second write bit line that is complementary to the first write bit line value; and
   a circuit, including:
      a pull up switch circuit to selectively apply the operating voltage to one of a first voltage node coupled to the first storage node and a second voltage node coupled to the second storage node, under control of the complementary write bit line values; and
      a voltage equalizer connected between the first and second voltage nodes, wherein, during a write to the bit cell, one of the first and second storage nodes into which a write bit line value of logic 1 is to be written is pulled up strongly to the operating voltage through the switch circuit, and the other of the first and second storage nodes into which a write bit line value of logic 0 is to be written is pulled up weakly through both the switch circuit and the voltage equalizer connected in series.

12. The system of claim 11, wherein the pull up switch circuit includes:
   a first transistor to selectively apply the operating voltage to the first voltage node under control of the first write bit line value; and
   a second transistor to selectively apply the operating voltage to the second voltage node under control of the complementary second write bit line value,
   wherein to write the write bit line values of logic 1 and logic 0 to the first and second storage nodes, respectively, the first storage node is pulled up strongly to the operating voltage through the first transistor, and the second storage node is pulled up weakly to the operating voltage through the first transistor and the equalizer connected in series, and
   wherein to write the write bit line values of logic 0 and logic 1 to the first and second storage nodes, respectively, the first storage node is pulled up weakly to the operating voltage through the second transistor and the voltage equalizer connected in series, and the second storage node is pulled up strongly to the operating voltage through the second transistor.

13. The system of claim 11, wherein:
the pull up switch circuit includes a transistor source-drain current path through which the operating voltage is applied to the one of the first and second voltage nodes; and
the voltage equalizer includes at least one transistor source-drain current path connected between the first and second voltage nodes, such that the one of the first and second storage nodes to which the logic one is to be written is pulled up strongly through the pull up circuit transistor source-drain current path, and the other of the first and second storage nodes to which the logic 0 is to be written is pulled up weakly through the pull up circuit transistor source-drain current path and the voltage equalizer at least one transistor source-drain current path connected in series.

14. The system of claim 11, wherein the voltage equalizer includes first and second transistors having their source-drain current paths connected in series between the first and second voltage nodes and each of their gates connected to a voltage supply rail to keep the first and second transistors always turned on.

15. The system of claim 14, wherein the pull up switch circuit includes:
   a first switch transistor having a source-drain current path connected between the operating voltage and the first voltage node, and a gate controlled by the first write bit line; and
   a second switch transistor having a source-drain current path connected between the operating voltage and the second voltage node, and a gate controlled by the second write bit line.

16. The system of claim 11, wherein the circuit further comprises a pull down weakening circuit, coupled to the first and second storage nodes, to weaken a pull down strength applied to the first and second storage nodes.

17. The system of claim 11, wherein the bit cell further comprises first and second cross-coupled inverters, the first inverter including a bit cell first pull up transistor coupled between the first storage node and the first voltage node, the second inverter including a bit cell second pull up transistor coupled between the second storage node and the second voltage node, wherein during the write to the bit cell the first and second storage nodes are pulled up to the operating voltage through the respective bit cell first and second pull up transistors and at least one of the switch circuit and the voltage equalizer, under control of the write line bit values.

18. The system of claim 17, wherein the first inverter further includes a bit cell first pull down transistor coupled between the first storage node and a pull down voltage node, and the bit cell second inverter further includes a bit cell second pull down transistor coupled between the second storage node and the pull down voltage node, the circuit further comprising a pull down weakening transistor having its source-drain current path connected between the pull down voltage node and a ground potential.

19. The system of claim 11, wherein the circuit further includes a logic retention circuit to provide a retention voltage to the first and second voltage nodes under control of a write enable signal so that the retention voltage is applied when the write to the bit cell does not occur.

20. The system of claim 19, wherein the logic retention circuit includes:
   a logic retention first switch transistor having a source-drain current path connected between the operating voltage and the first voltage node, and a gate controlled by the write enable signal; and
   a logic retention second switch transistor having a source-drain current path connected between the operating voltage and the second voltage node, and a gate controlled by the write enable signal.

* * * * *